United States Patent [19]

Nakano

[11] Patent Number: 5,132,507
[45] Date of Patent: Jul. 21, 1992

[54] APPARATUS AND A METHOD FOR CHECKING A SEMICONDUCTOR

[75] Inventor: Akihiko Nakano, Nara, Japan

[73] Assignee: Sharp Kabushiki Kaisha, Japan

[21] Appl. No.: 676,438

[22] Filed: Mar. 28, 1991

Related U.S. Application Data

[62] Division of Ser. No. 33,307, Dec. 24, 1990, Pat. No. 5,089,774.

[30] Foreign Application Priority Data

Dec. 26, 1989 [JP] Japan .................................. 1-339295
Dec. 29, 1989 [JP] Japan .................................. 1-344027

[51] Int. Cl.⁵ .............................................. B23K 15/00
[52] U.S. Cl. ............................ 219/121.31; 219/121.19
[58] Field of Search ...................... 219/121.15, 121.20, 219/121.31, 121.32; 437/8, 225

[56] References Cited

U.S. PATENT DOCUMENTS 4,154,530 5/1979 Connolly, Jr. et al. ............. 356/152

Primary Examiner—C. L. Albritton
Attorney, Agent, or Firm—Nixon & Vanderhye

[57] ABSTRACT

An apparatus for checking a semiconductor comprising an X-Y stage for movably holding a semiconductor chip in terms of X-Y coordinates, a charged particle beam radiating device for radiating a charged particle beam on the semiconductor chip held in the X-Y stage to generate secondary electrons therefrom, a detecting device for detecting secondary electrons emitted from the semiconductor, a magnifying device for displaying an enlarged image of the semiconductor chip on the basis of data of the detected secondary electrons, a semiconductor tester for measuring electrical characteristics of the semiconductor chip to specify a defective element of circuit elements constituting the semiconductor chip on the basis of a result of the measurement, a defective portion locating device provided with table data of a layout pattern showing the relationship between the circuit elements constituting the semiconductor chip and the arrangement thereof, for obtaining on the basis of the table data position data of the defective circuit element specified by the semiconductor tester, and a control device for issuing instructions to operate the X-Y stage, charged particle beam radiating device, and magnifying device, and further to cause the charged particle beam radiating device to impress marks on the semiconductor chip for indicating a position of the defective circuit element in positions apart from the defective circuit element at predetermined spaces by the charged particle beam radiation on the basis of the position data of the defective circuit element obtained by the defective portion locating device.

7 Claims, 8 Drawing Sheets

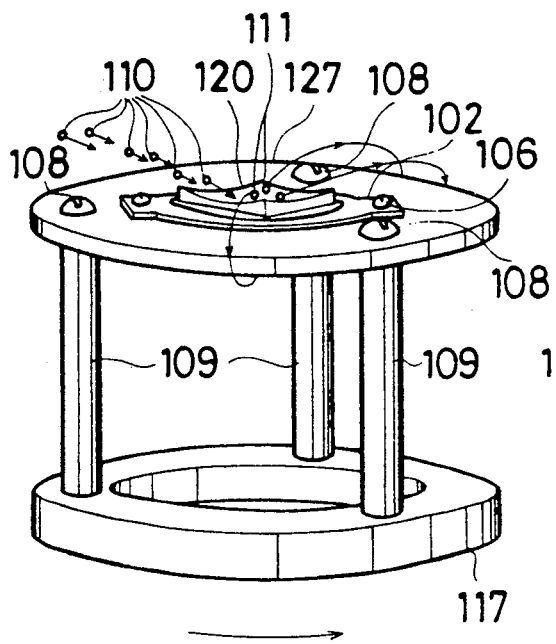
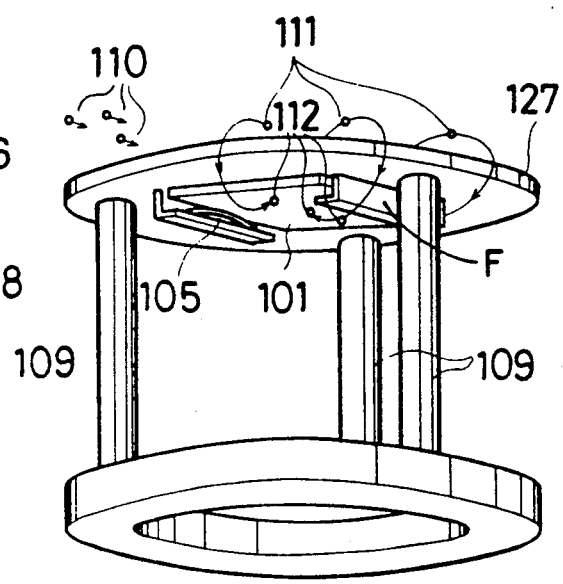
FIG. 7(A)   FIG. 7(B)
FIG. 7(C)
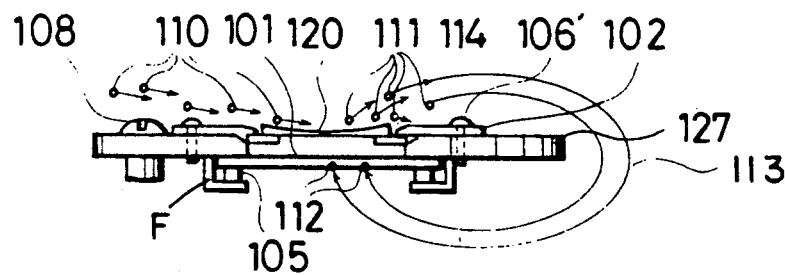

APPARATUS AND A METHOD FOR CHECKING A SEMICONDUCTOR

This is a division of application Ser. No. 07/633,307, filed Dec. 24, 1990, now U.S. Pat. No. 5,089,774.

BACKGROUND OF THE INVENTION

1. Field of the Invention

The present invention relates to an apparatus and a method for checking the cause of defects of a semiconductor device such as an LSI.

2. Description of the Prior Art

Conventionally, the following method has been employed in order to check the cause of defects of a semiconductor device such as an LSI. First, the semiconductor device having an electric defect is broken out so that an inner semiconductor chip is exposed. Then, the semiconductor device is electrically checked by means of a semiconductor tester. The result of check is printed out and thus the defect in a circuit of the semiconductor chip is confirmed. With reference to another design drawing, a defective portion (hereinafter referred to as a defective address) on the semiconductor chip is found. As shown in FIG. 9 (a), a semiconductor chip 10' is then taken out of a package of the semiconductor device so as to be cut into a sample chip piece 20 by means of a dicing machine or the like. The sample chip piece 20 has a defective address 21 in the center thereof. As shown in FIG. 9 (b), the back of the sample chip piece 20 is abraded by means of a plane abrasive machine to a thickness of about 50 μm. In FIG. 9 (b), only an abrasive table 26 of the plane abrasive machine is shown. If the thickness of the sample chip piece 20 is less than 50 μm, the sample chip piece 20 may be damaged. Therefore, a charged particle beam processing apparatus is finally used. The detailed description of the above steps will be given later. In brief, with reference to FIGS. 9 (c) and (d), the abraded sample chip piece 20 is mounted on a sample supporting table (sample supporting plate) 27 which is a so-called mesh. Then, the sample supporting table 27 is fixed to the charged particle beam processing apparatus. Consequently, the sample chip piece 20 is rotated together with the sample supporting table 27. At the same time, a charged particle beam is radiated at an angle of 15° to the back of the sample chip piece 20 through a round hole 271 formed in the center of the sample supporting table 27. Consequently, the center of the back of the sample chip piece 20 is made cone-shaped. The center of the sample chip piece 20 is abraded to a thickness of about 50 nm. Then, the defect of crystals in the defective address of the sample chip piece 20 is observed by means of a transmission type electron microscope so that the cause of defects of the semiconductor device is checked.

In the prior art, however, there have been pointed out the following drawbacks.

Even if the defective portion on the circuit of the semiconductor chip 10' can be confirmed by the semiconductor tester, a physical position (the defective address 21) of the semiconductor chip 10' should be specified with reference to the design drawing. This process is so complicated that the skilled often make an error.

In addition, even if the defective address 21 of the semiconductor chip 10' can be confirmed, the defective address 21 rarely corresponds to the center of the sample chip piece 20 to be observed by the transmission type electron microscope. In the cast where the semiconductor chip 10' is repeatedly formed with patterns, a great problem is especially raised. As a result, the cause of defects of the semiconductor device cannot be checked precisely.

Next, a conventional charged particle beam processing apparatus will be described in detail.

In FIG. 10, a material supporting table 127 is supported by three legs 109 and can be rotated in a direction of an arrow. The reference numeral 108 denotes screws by which the legs 109 are fixed to the material supporting table 127.

The reference numeral 120 is a material which is positioned on a material reinforcing plate 104. The reference numeral 110 denotes charged beam particles which are radiated on the material 120 obliquely.

As shown in FIG. 10 (c), scattered substances 111 adhere to a portion (a lower surface), on which the charged beam particles 110 do not directly strike, through a path 113, i.e., a path on the periphery of the material supporting table 127, or through a clearance between the material reinforcing plate 104 and the material supporting table 127. In addition, various dirt particles 112 adhere to the aforementioned portion in an atmosphere.

In other words, as shown in FIG. 11, a dirt layer 115 adheres to the back of the material to be flaked. Consequently, a portion 120' to be observed by the transmission type electron microscope is superposed on the dirt layer 115, so that the material itself cannot be observed by the transmission type electron microscope.

The charged beam is radiated in the opposite direction so that the dirt layer 115 is abraded. Consequently, the portion 120' is exposed so as to be observed by the transmission type electron microscope.

In order to confirm whether the flaked material can be observed by the transmission type electron microscope when the charged beam abrasion is completed, the following countermeasure is considered. In other words, there is provided a device for radiating light on the portion to be processed in one direction so that the light can be detected in the opposite direction. In addition, a hole is formed on the material supporting table so that the light can be transmitted. If the hole is opened, the abrasion is automatically completed.

However, the aforementioned prior art has the following drawbacks.

(1) In the case where the dirt layer adheres to a nonabraded surface, it is required to radiate the charged beam on the dirt layer to be abraded. However, the portion 120' to be observed by the transmission type electron microscope (see FIG. 11) is often abraded and removal together with the dirt layer. Consequently, a good image of the material cannot be obtained by the transmission type electron microscope.

(2) The scattered substances 111 adhere to the nonabraded surface not only through the path 113 but also through a path 114 between the material supporting table 127 and the material reinforcing plate 104 (mesh).

(3) When the charged beam abrasion is completed, it is required to detect an end point by light transmission in order to decide whether the material surface can be observed by the transmission type electron microscope. Therefore, even if it is known that the dirt is produced, a hole must be formed on the material supporting table body.

SUMMARY OF THE INVENTION

The present invention provides an apparatus for checking a semiconductor comprising an X-Y stage for movably holding a semiconductor chip in terms of X-Y coordinates, charged particle beam radiating means for radiating a charged particle beam on the semiconductor chip held in the X-Y stage to generate secondary electrons therefrom, detecting means for detecting secondary electrons emitted from the semiconductor, magnifying means for displaying an enlarged image of the semiconductor chip on the basis of data of the detected secondary electrons, a semiconductor tester for measuring electrical characteristics of the semiconductor chip to specify a defective element of circuit elements constituting the semiconductor chip on the basis of a result of the measurement, defective portion locating means provided with table data of a layout pattern showing the relationship between the circuit elements constituting the semiconductor chip and the arrangement thereof, for obtaining on the basis of the table data position data of the defective circuit element specified by the semiconductor tester, and control means for issuing instructions to operate the X-Y stage, charged particle beam radiating means, and magnifying means, and further to cause the charged particle beam radiating means to impress marks on the semiconductor chip for indicating a position of the defective circuit element in positions apart from the defective circuit element at predetermined spaces by the charged particle beam radiation on the basis of the position data of the defective circuit element obtained by the defective portion locating means.

According to the present invention, the control means controls the charged particle beam used for displaying an enlarged image of the semiconductor chip so as to impress marks for indicating a position of the defective circuit element of the semiconductor chip. Consequently, the cause of defects of the semiconductor chip can be checked precisely and easily.

In another respect, the present invention can provide a method for checking a semiconductor comprising the steps of radiating a charged particle beam to impress marks in positions apart from a defective circuit element of the semiconductor chip at predetermined spaces, cutting the semiconductor chip having the marks into a sample chip piece, and specifying the defective circuit element on the sample chip piece based on the marks by means of a transmission type electron microscope so as to check the cause of defects of the circuit element.

In a further respect, the present invention can provide a charged beam processing apparatus comprising a supporting table having a hole provided in the center thereof, a material reinforcing plate of an annular shape provided on an inner peripheral edge of the hole, a surface guard plate, a frame removably provided on the supporting table for sealing the hole on a non-abraded surface side of the sample chip piece, an annular presser plate provided on the supporting table for sealing an annular clearance between the supporting table and the material reinforcing plate on the non-abraded surface of the sample chip piece, and a charged beam mirror for radiating the charged beam on the sample chip piece which is placed so as to cover the hole defined by the material reinforcing plate so that the sample chip piece is processed.

BRIEF DESCRIPTION OF THE DRAWINGS

FIG. 5 (b) is a section view of the sample chip piece corresponding to FIG. 5 (a);

FIG. 6 (b) is a section view taken along the line A-A' of FIG. 6 (a);

FIG. 6 (c) is a bottom view of the material supporting table;

FIG. 7 (a) is a perspective view of the material supporting table seen from above;

FIG. 7 (b) is a perspective view of the material supporting table seen from below;

FIG. 7 (c) is a central section view of the material supporting table;

DETAILED DESCRIPTION OF PREFERRED EMBODIMENTS

There will be described a schematic structure of a semiconductor checking apparatus with reference to FIG. 1.

Figure 1:
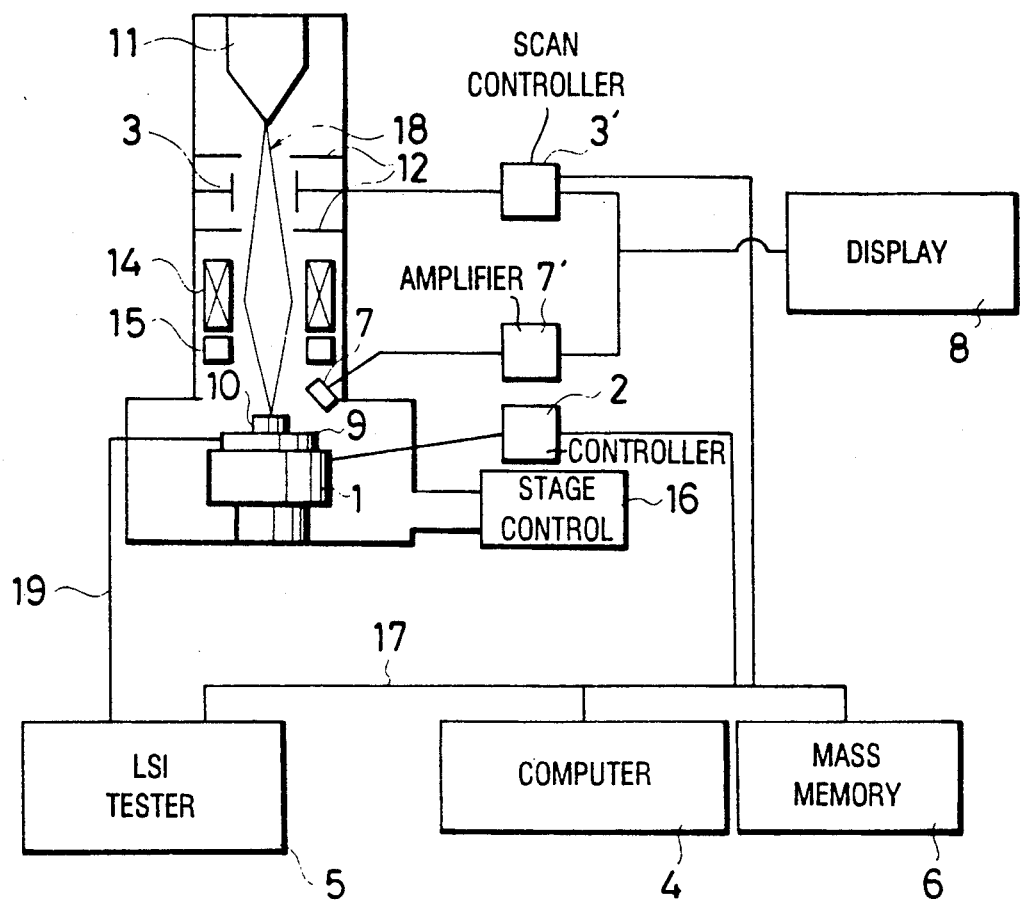
FIG. 1 is a view showing a structure of a semiconductor checking apparatus.

In FIG. 1, the reference numeral 16 denotes an evacuator which evacuates the inside of the semiconductor checking apparatus. The semiconductor checking apparatus has an X-Y stage 1 provided on the inner bottom thereof. The X-Y stage 1 moves a semiconductor device 10 freely in terms of X-Y coordinates. The reference numeral 2 denotes an X-Y stage controller. The semiconductor device 10 can be connected to a connector 9 which is provided on the X-Y stage 1. With the semiconductor device 10 connected to the connector 9, an LSI tester 5 (which corresponds to a semiconductor tester) checks defective portions on a circuit of the semiconductor device 10 (the detailed description will be given later).

The semiconductor device 10 has a top portion of a package broken out in advance (not shown). Consequently, an inner semiconductor chip 10' is exposed.

On the other hand, an apparatus body has a beam generating portion 11 provided in an upper portion thereof. The beam generating portion 11 generates a charged particle beam 18 to be emitted toward the X-Y stage 1. An aperture 12, a scanning coil 3, an aperture 12, a beam lens 14 and a lens 15 for correcting beam non-point aberration are sequentially provided between the beam generating portion 11 and the X-Y stage 1. In other words, the aforementioned optical lens system gives energy to the charged particle beam 18 which is generated by the beam generating portion 11. Consequently, the charged particle beam 18 is converged and scanned so as to be radiated on the semiconductor chip 10'. A timing for scanning the charged particle beam 18 is controlled by a scanning controller 3' on the basis of synchronizing signals outputted from a display 8 to be described below.

When the charged particle beam 18 having the predetermined energy is radiated on the semiconductor chip 10', secondary electrons are generated from the radiated portion. The secondary electrons are detected by a secondary electron detector 7 which is provided in the vicinity of the X-Y stage 1. The signals outputted from the secondary electron detector 7 are successively introduced into the display 8 through a secondary electron signal amplifier 7' so that an enlarged image of the semiconductor chip 10' is displayed and outputted.

Next, there will be described the LSI tester 5. The LSI tester 5 has data on electric characteristics of the semiconductor device 10 prestored therein. Wit the semiconductor device 10 powdered, a predetermined operation is carried out so that the detective portions on the circuit can be checked. If the semiconductor device 10 is a dynamic memory, the predetermined data is written into all addresses and then read out in order of address. If the read data is different from others, it is decided that a circuit element portion corresponding to the address is defective. The data for defective portions on the circuit of the semiconductor device 10, which are outputted from the LSI tester 5, are led to a computer 4 in a predetermined timing.

The computer 4 has a program required to control the entire apparatus prestored therein. In addition, the computer 4 gives individual instructions for predeterminately operating the LSI tester 5, the display 8, an X-Y stage controller 16, the scanning controller 3' and the like through a data transfer network 17. Furthermore, the computer 4 is provided with a data base 6 such as a floppy disc which serves as a mass external memory. The data base 6 stores table data of a layout pattern showing the relationship between circuit elements constituting the semiconductor chip 10' and the arrangement thereof. In other words, the individual data stored in the data base 6 are coordinate data for every circuit element formed on the semiconductor chip 10'. The coordinate data are displayed by means of X'-Y' coordinate system. The X'-Y' coordinate system is set such that a plurality of alignment marks provided on the semiconductor chip 10' are reference points. Software of the computer 4 has a function of locating the defective portions.

Next, there will be described an operation of the semiconductor checking apparatus having the above structure and a function of the computer 4.

First, the semiconductor device 10 of which semiconductor chip 10' is exposed is connected to the connector 9 so as to operate the LSI tester 5. Then, the LSI tester 5 gives the data for the defective portions on the circuit of the semiconductor device 10 to the data base 6 through the computer 4. The data which are given to the data base 6 relate to the defective circuit element in the semiconductor chip 10' as described above, and are converted by the table data of the data base 6 so that the coordinate data corresponding to the circuit elements are obtained (the aforementioned function of the computer 4 corresponds to that of a section for locating defective portions). The coordinate data become data which give the defective portion of the semiconductor chip 10', i.e., a defective address 21 (see FIG. 2). Then, the coordinate data are once stored in predetermined addresses of the data base 6.

In consideration of the degree of integration of the semiconductor device 10, it is required that feed precision of the X-Y stage 1 is 0.1 μm or less. In a method of attaching the semiconductor device 10 to the X-Y stage 1, however, positioning precision of the semiconductor device 10 for the X-Y stage 1 becomes a problem. Therefore, the alignment marks in the semiconductor chip 10' are enlarged and displayed. Then, the X-Y stage 1 is operated so that the alignment marks correspond to the reference points of the X-Y coordinate system which are simultaneously displayed on a screen. Consequently, the X-Y coordinate system on the X-Y stage 1 side corresponds to the X'-Y' coordinate system on the semiconductor chip 10' side irrespective of the connection of the semiconductor device 10 to the connector 9.

Figure 2:
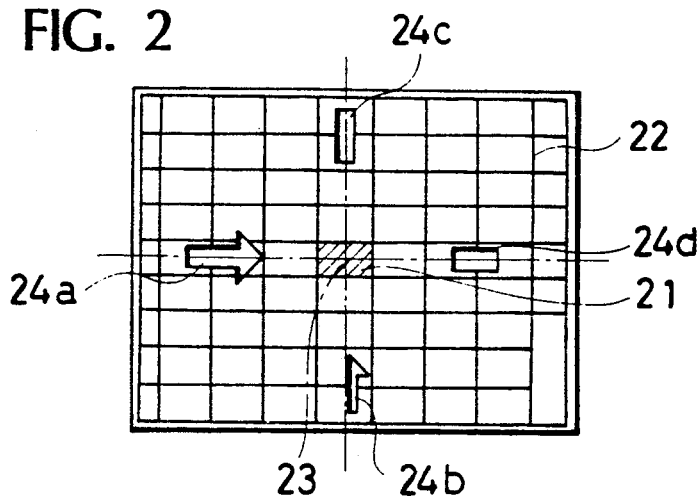
FIG. 2 is a view showing an enlarged image of a semiconductor chip having marks.

Then, when the X-Y stage 1 is operated on the basis of the coordinate data of the defective address 21 which is stored in the data base 6, the defective address 21 on the semiconductor chip 10' is displayed on the screen of the display 8. FIG. 2 shows an image, which is enlarged by the display 8, in the vicinity of the defective address 21 on the semiconductor chip 10'. In FIG. 2, the reference numeral 22 denotes a circuit pattern which is provided like a lattice on the semiconductor chip 10' and the reference numeral 23 denotes a reference point (which corresponds to a reference point of marking to be described below) on the display 8 side.

As shown in FIG. 2, the following process is performed so that four marks 24a to 24d are impressed in positions apart from the defective address 21 on the semiconductor chip 10' at predetermined spaces.

First, the coordinate data in positions in which the marks 24a to 24d are to be impressed are calculated on the basis of the coordinate data of the defective address 21 stored in the data base 6. In this case, there are read the pattern data on the positional relationship between the defective address 21 prestored in the data base 6 and the marks 24a to 24d. When the coordinate data is calculated, the beam generating portion 11, the scanning controller 3' and the like are operated so that the charged particle beam 18 having the predetermined energy is scanned and radiated on the semiconductor chip 10'. Consequently, holes are formed by radiation of the charged particle beam 18, so that the marks 24a to 24d are impressed in desired positions.

There will be described the form of the marks 24a to 24d and the like. The size of the marks 24a to 24d and the distance between the marks 24a to 24d and the defective address 21 are set such that the marks 24a to 24d and the defective address 21 can be displayed on the screen of the display 8 and confirmed clearly. If the size of the marks 24a to 24d are 2 to 3 μm square or more, the marks 24a to 24d can be observed by means of a stereomicroscope of about 40 magnifications. In addition, the marks 24a to 24d are shaped such that the position of the defective address 21 can clearly be confirmed. Furthermore, the entire form of the marks 24a to 24d is asymmetrical. The marks 24a to 24d have a plurality of patterns which can properly be selected according to the shape of the defective portion.

In consideration of a flaking step to be described below, the depth of the marks 24a to 24d is set to a value necessary for the semiconductor chip 10' to reach a semiconductor substrate. If the defects are not caused by the semiconductor substrate but by a shallow electrode portion, it is not necessary for the depth of the marks 24a to 24d to reach the semiconductor substrate.

In the present embodiment, the charged particle beam generated by the beam generating portion 11 is a gallium ion beam. A beam diameter is set to 500 Å or less so that good images can be obtained at the time of image display. In the case where the marking is performed, a current value can be set higher than the aforementioned value so as to increase a processing speed. In this case, the current value may be increased so that the beam diameter is about 2000 to 3000 Å.

When the marking is completed, the display 8 is operated so as to confirm whether the positional relationship between the marks 24a to 24d and the defective address 21 is precise by means of the enlarged image.

When the confirmation is completed, the semiconductor device 10 is taken out of the semiconductor checking apparatus. Then, a sample for a transmission type electron microscope (not shown) is prepared.

Figure 3:
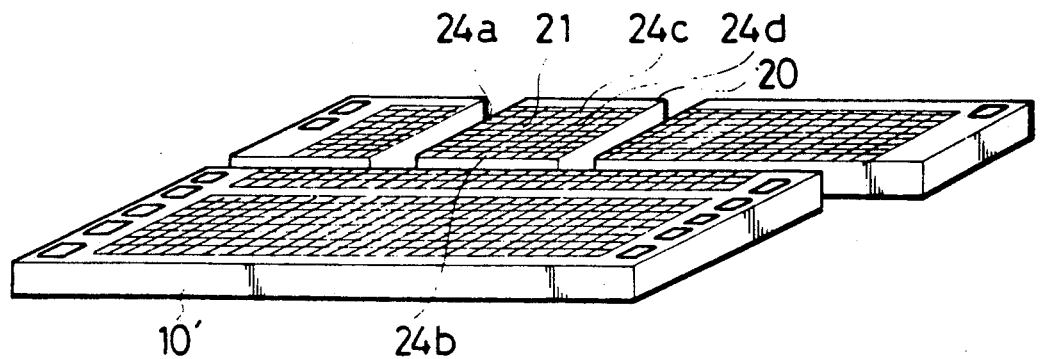
FIG. 3 is a view showing a state in which a sample chip piece is cut out of the semiconductor chip.

First, the semiconductor chip 10' is taken out of a package of the semiconductor device 10. As shown in FIG. 3, the semiconductor chip 10' is cut into a sample chip piece 20 by means of a dicing machine (not shown). The size of the sample chip piece 20 is suitable for the sample of the transmission type electron microscope, i.e., about 1.5 mm square. In this case, the sample chip piece 20 is precisely cut out by means of the stereomicroscope attached to the dicing machine so that defective address 21 is positioned in the center of the sample chip piece 20. The centering is greatly concerned with observation precision of the transmission type electron microscope. Therefore, it si required to perform the centering carefully.

Next, the sample chip piece 20 thus cut away from the semiconductor chip 10' is taken out of the dicing machine. Then, a surface forming layer such as an electrode in the sample chip piece 20 is flaked by means of chemicals. The chemicals by which the semiconductor substrate of the sample chip piece 20 is not affected are used for flaking. If the defects are not caused by the semiconductor substrate but by the shallow electrode portion, the flaking is performed so that the electrode portion is exposed.

Figure 4:
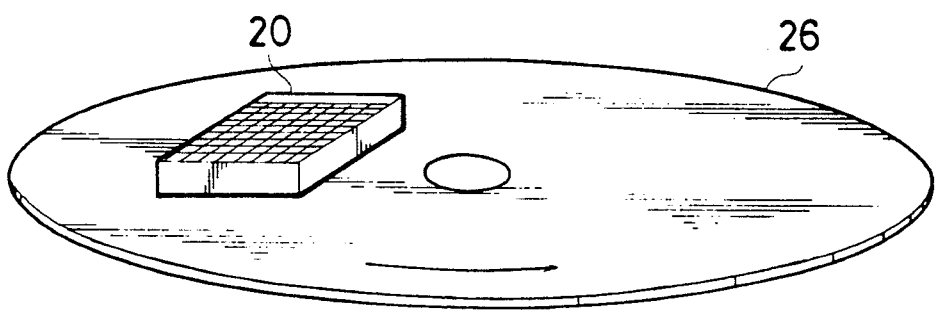
FIG. 4 is a view showing a state in which the sample chip piece is abraded by means of an abrasive machine.

When the flaking is completed, the flaked sample chip piece 20 is abraded so as to have a depth of 50 μm or less by means of a rotary abrasive machine and then is mirror-abraded. FIG. 4 shows a state in which the back of the sample chip piece 20 is abraded by means of the abrasive machine. In FIG. 4, parts other than an abrasive table 26 are omitted. In order to obtain high abrasive precision, dimple-like mechanical abrasion is sometimes carried out. In this case, the center of a dimple is caused to correspond to the center of the defective address 21, the sample chip piece 20 is abraded to have a depth of 10 μm or less and the mirror-abraded so that the back of the defective address 21 is made the thinnest. In case of the dimple-like abrasion, if the depth of the marks 24a to 24d is set of about 10 μm, the marks 24a to 24d are seen through the back of the sample chip piece 20 during the abrasion. Consequently, even if the center of the dimple does not correspond to the center of the defective address 21, a processing position can be corrected in the middle of the abrasion.

Figure 5A:
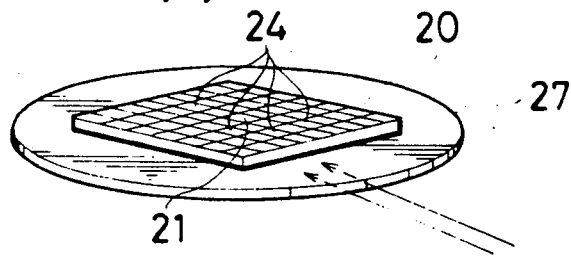
FIG. 5 (a) is a view showing a state in which the sample chip piece is flaked by means of a charged particle beam processing apparatus.
Figure 5B:
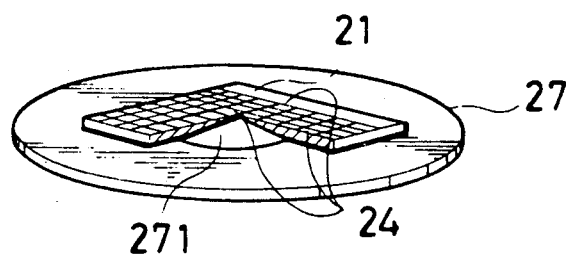

When the abrasion is completed, the sample chip piece 20 is finally flaked by means of another charged particle beam processing apparatus K. While the specific description of the charged particle beam processing apparatus K will be given later, its brief description is as follows. First, the mirror-abraded sample chip piece 20 is fixed to a sample supporting plate 27 (mesh) shown in FIG. 5 and then mounted on the charged particle beam processing apparatus. When the charged particle beam processing apparatus is operated, the sample chip piece 20 is rotated together with the sample supporting plate 27. At the same time, the charged particle beam is radiated toward the center of the back of the sample chip piece 20 through a round hole 271 which is formed in the center of the sample supporting plate 27. Consequently, the back of the sample chip piece 20 is made cone-shaped. In the above method, the center of the defective address 21 of the sample chip piece 20 is flaked so as to have a depth of about 50 μm.

According to the charged particle beam processing apparatus, an argon ion beam which is relatively thick is used in order to increase the processing speed and an incident angle to the back of the sample chip piece 20 is set to about 10° to 15°.

When the flaking is completed, the sample chip piece 20 is taken out of the charged particle beam processing apparatus together with the sample supporting plate 27 and then mounted on the transmission type electron microscope (not shown). An enlarged image o the sample chip piece 20 is displayed and outputted by the transmission type electron microscope. At this time, since the marks 24a to 24d are clearly displayed on the screen, the defective address 21 can be specified without errors. The cause of defects of the semiconductor device 10 is checked by the enlarged image.

In the case where the cause of defects of the semiconductor device 10 is checked in the above procedure, the following effect can be obtained if the semiconductor checking apparatus is used.

In other words, even if the defective address 21 does not correspond to a portion of the sample chip piece 20 which is flaked so as have a depth of about 50 μm by the charged particle beam processing apparatus, the non-correspondence can be confirmed by the marks 24a to 24d in a stage in which the image of the sample chip piece 20 is enlarged and displayed by the transmission type electron microscope. Consequently, the address can be checked without errors. Since the image can be obtained even if the sample chip piece 20 is turned over, the defective address 21 may be confirmed with errors. However, since the entire form of the marks 24a to 24d is asymmetrical, it can be confirmed that the sample chip piece 20 is turned over. Accordingly, the transmission type electron microscope can display and output the directly enlarged image of a portion which is electrically defective on the semiconductor chip 10' of the semiconductor device 10. Consequently, the cause of defects of the semiconductor device 10 can be checked precisely and effectively.

The semiconductor checking apparatus of the present invention is not limited to the above embodiment. There may be employed a so-called inverted semiconductor checking apparatus in which the charged particle beam is radiated on the semiconductor chip from a lower portion thereof. In the case where the above form is used, the connector for connecting the semiconductor chip to the LSI tester can be attached to the apparatus downward and a tester head can be mounted on the connector. Therefore, electric wires can be made as short as possible so that a noise can be reduced. Consequently, the electrical checking can be performed on the semiconductor chip with high precision.

According to a semiconductor checking apparatus H having the above structure, the data of the defective circuit element of the semiconductor chip specified by the semiconductor tester can be obtained by the section for locating defective portions. Consequently, the defective address of the semiconductor chip can be obtained automatically. Therefore, the defective address can precisely be obtained without performing the conventionally complicated working. In addition, when the charged particle beam is radiated, the marks are impressed so as to indicate the defective address of the semiconductor chip. Consequently, the defective address of the semiconductor chip can be specified without errors in the subsequent steps.

On the other hand, according to a method for checking a semiconductor of the present invention, the defective address can be specified without errors based on the marks on the semiconductor chip by means of the transmission type electron microscope. Consequently, the state of the defective address can be observed directly.

Accordingly, the cause of defects of the semiconductor device can be checked precisely and effectively.

Next, there will be described a specific example of a charged particle beam processing apparatus 100 K.

Figure 6A:
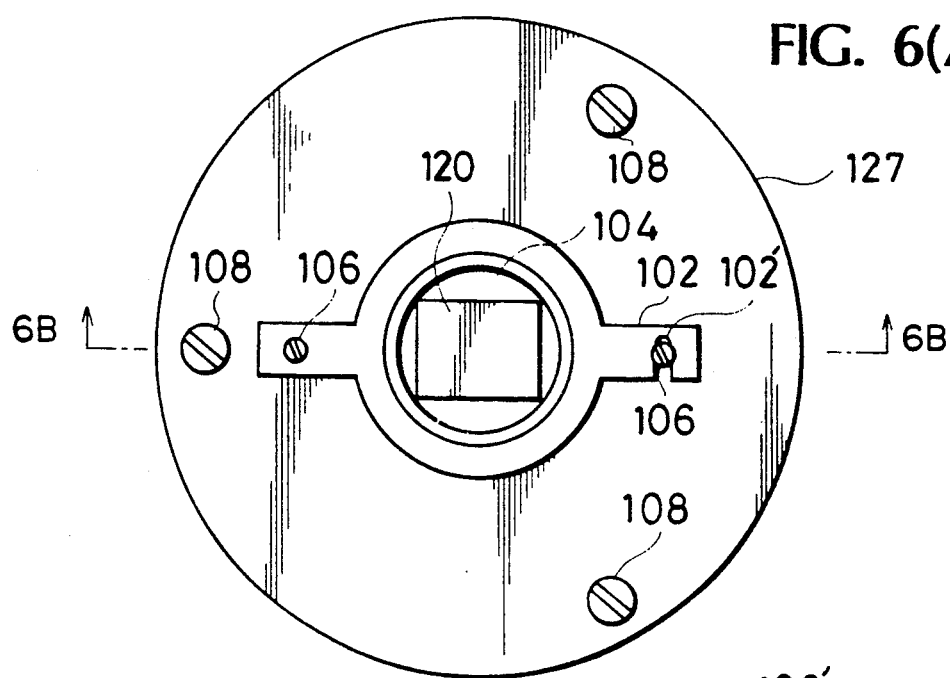
FIG. 6 (a) is a plan view of a material supporting table which is a main portion of the charged beam processing apparatus.
Figure 6B:
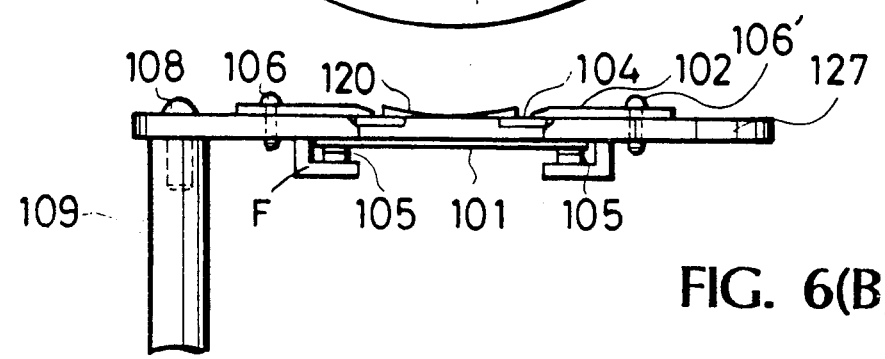
Figure 6C:
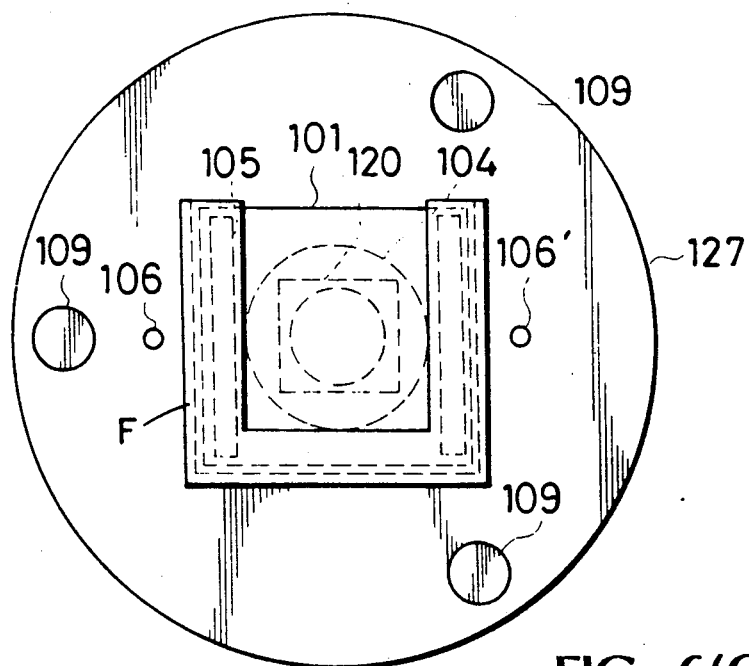
Figure 8:
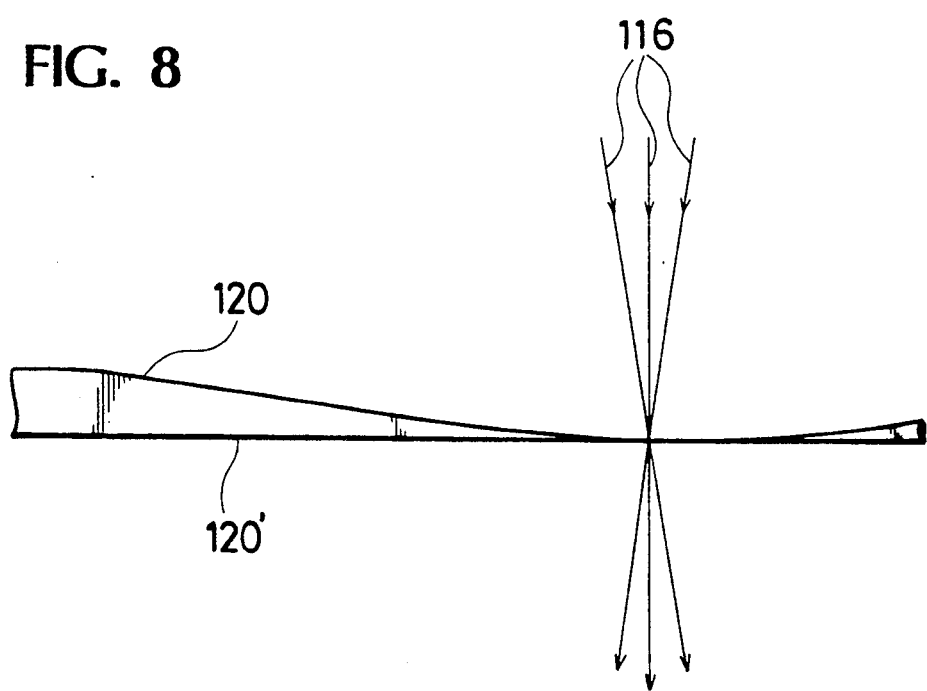
FIG. 8 is a typical section view of a sample to be observed by a transmission type electron microscope, a central portion of the sample being enlarged.
Figure 9A:
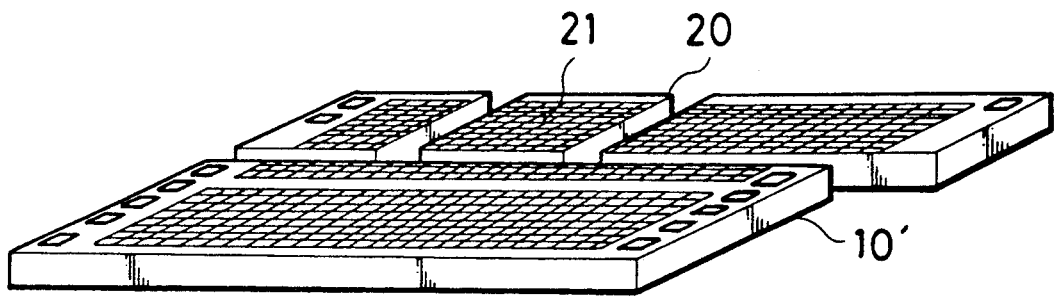
FIGS. 9 (a) to (d) are views for explaining a conventional example corresponding to FIGS. 3, 4, and 5 (a) and (b), respectively.
Figure 9B:
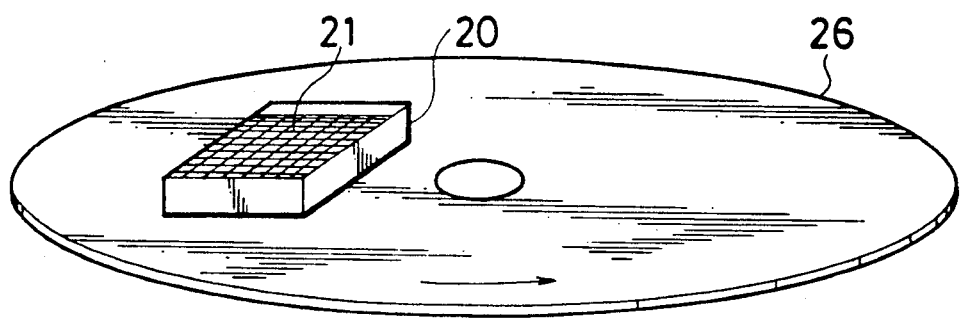
Figure 9C:
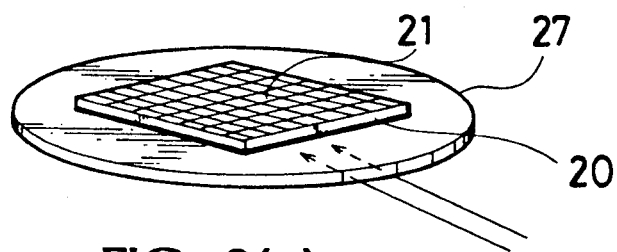
Figure 9D:
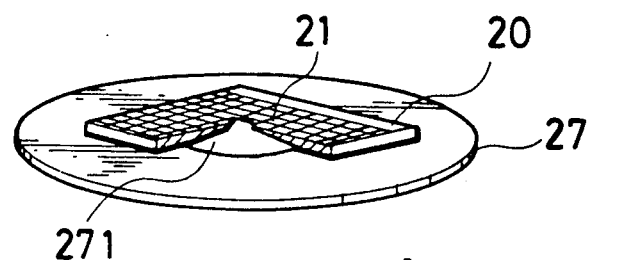
Figure 10A:
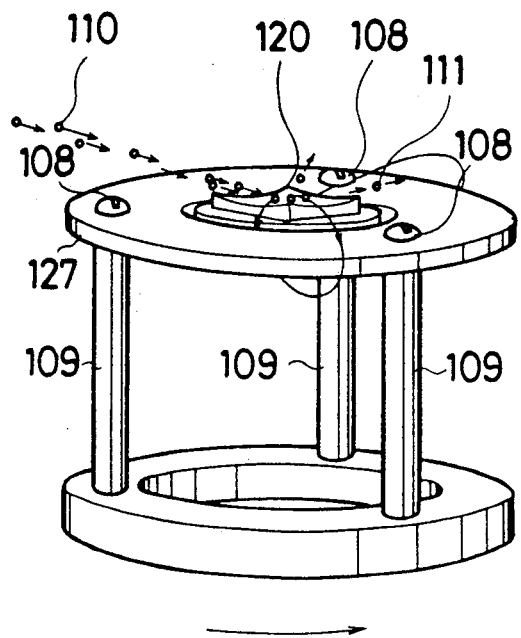
FIGS. 10 (a) to (c) are views for explaining the conventional example corresponding to FIGS. 7 (a) to (c), respectively.
Figure 10B:
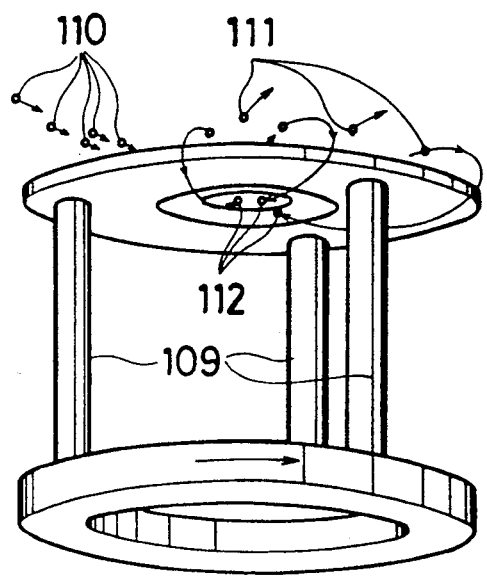
Figure 10C:
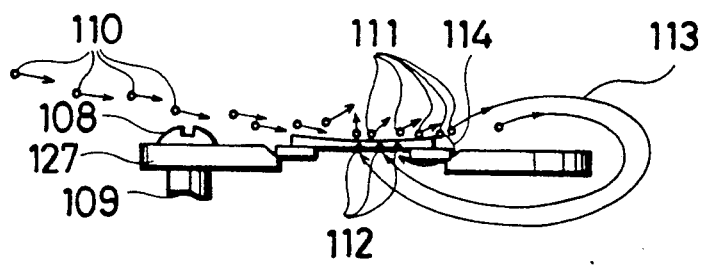

In FIGS. 6 to 8, the reference numeral 101 denotes a surface guard plate which is square-shaped. The reference numerals 105, 105 denote springs which are strip-shaped. The surface guard plate 101 is pressingly and removably fixed to a material supporting table (sample supporting plate) 127 by the springs 105, 105 and frame member F. Although the frame F is illustrated in FIG. 7(B) as including only two side members, the three-sided frame member F as shown in FIG. 6(C) is preferred. The reference numeral 102 denotes a presser plate. The presser plate 102 has an annular portion and portions which are rectangularly extended from the annular portion right and left. In addition, the presser plate 102 has a sufficient size to cover an annular clearance between a material reinforcing plate 104 and the material supporting table 127 and has the rectangularly extended portions fixed to the material supporting table 127 by means of screws 106, 106'. Consequently, the clearance between the material reinforcing plate 104 and the material supporting table 127 is covered and the material reinforcing plate 104 is fixed to the material supporting table 127. If loosened, the screws 106, 106' can easily be removed from the presser plate 102 and a groove 102' of the presser plate 102. Consequently, the presser plate 102 can be removed from the material supporting table 127. Accordingly, a processed material (sample chip piece) 120 can easily be taken out of the material supporting table 127 together with the material reinforcing plate 104.

There will be described a series of working of the following case in accordance with the procedure. In other words, a material formed by applying a polycrystalline silicon onto a surface of a silicon monocrystalline semiconductor is observed by a transmission type electron microscope on a plane basis as described below.

(1) First, a silicon wafer is cut out by means of a glass cutter or scribe machine so as to have a size of 1 mm square.

(2) The silicon wafer thus cut out has a thickness of 300 to 700 $\mu$m normally. Therefore, the side to which the polycrystalline silicon is not applied is mechanically abraded to a thickness of 50 to 100 $\mu$m. The mechanical abrasion is performed on a rotary abrasive table by means of an about 2000-count sand paper or an abrasive solution in which a diamond abrasive grindstone having a size of 2 to 3 $\mu$m is floated until the silicon wafer has a thickness of about 50 to 100 $\mu$m. Then, buff abrasion is performed on the mechanically abraded side to be mirror-finished by means of a diamond having a size of about 0.5 $\mu$m or an abrasive solution in which an alumina abrasive grindstone is floated.

(3) Next, a material 120 is stuck by means of a rubber adhesive or an epoxy adhesive with the polycrystalline silicon 120' side, i.e., the non-abraded side opposite to the material reinforcing plate 104 (generally referred to as a mesh). In this case, it is required that the material 120 is stuck so as not to form a clearance between the material 120 and the material reinforcing plate 104.

(4) Then, the material 120 is placed on the material supporting table 127 together with the material reinforcing plate 104. Thereafter, the presser plate 102 is fixed onto them by means of the screws 106, 106'. In this case, the non-abraded side, i.e., the side to which the polycrystalline silicon is applied is arranged toward the material supporting table 127 side, while the side which is abraded and mirror-finished with being fixed by means of the presser plate 102 is arranged so as to be exposed to the charged beam.

(5) The surface guard plate 101 is inserted into a groove formed on the underside of the material supporting table 127 in which springs are provided, and then pressingly fixed to the material supporting table 127. In this case, it is preferred that a glass plate having a thickness of 150 to 200 $\mu$m is used as the surface guard plate 101. In addition, there may be used a transparent plastic having any material and thickness such as an acrylic plate or a vinyl plate.

(6) The entire material supporting table 117 is mounted on the charged beam processing apparatus to be evacuated. When the degree of vacuum reaches $1 \times 10^{-5}$ torr or less at which the charged beam is generated, an Ar ion beam of I ion beam is radiated so as to perform abrasion. The ion beam having a size of about 0.3 mm is radiated at an angle of about 15° to a horizontal surface of the material so that the abrasion is performed. In this case, it is required to rotate the material supporting table 127 once or twice per minute so that the material is abraded in order to have a uniform thickness entirely.

When passing through a path 113 on the periphery of the material supporting table 127, particles which are abraded and scattered by the ion beam adhere to the surface guard plate 101. When passing through a path 114 between the material reinforcing plate 104 and the material supporting table 127, the particles adhere to the presser plate 102. As a result, there can be prepared a sample suitable for observation by the transmission type electron microscope without the scattered particles adhering to the surface of the material. Packing is provided on the material supporting table 127 side between the presser plate 102 and the material supporting table 127 and between the surface guard plate 101 and the material supporting table 127 so that the scattered particles can be blocked completely. The packing is formed of a material which cannot be processed by an Ar ion or the like.

A He-Ne laser beam is radiated on the material with a light receiving element provided on the underside thereof, so that the progress of abrasion can be known. In other words, when the silicon wafer is made thinner so that the transmission of the laser beam can be confirmed by the light receiving element, the radiation of the ion beam is stopped.

In the present embodiment, a laser beam which is excellent in rectilinearity is used so that the distance between a light source and a light receiving portion can be greater. While a silicon is employed as a material in the present embodiment, the surface guard plate of which light transmittance is reduced may be used if there is used a material through which light can be transmitted more easily.

Figure 11:
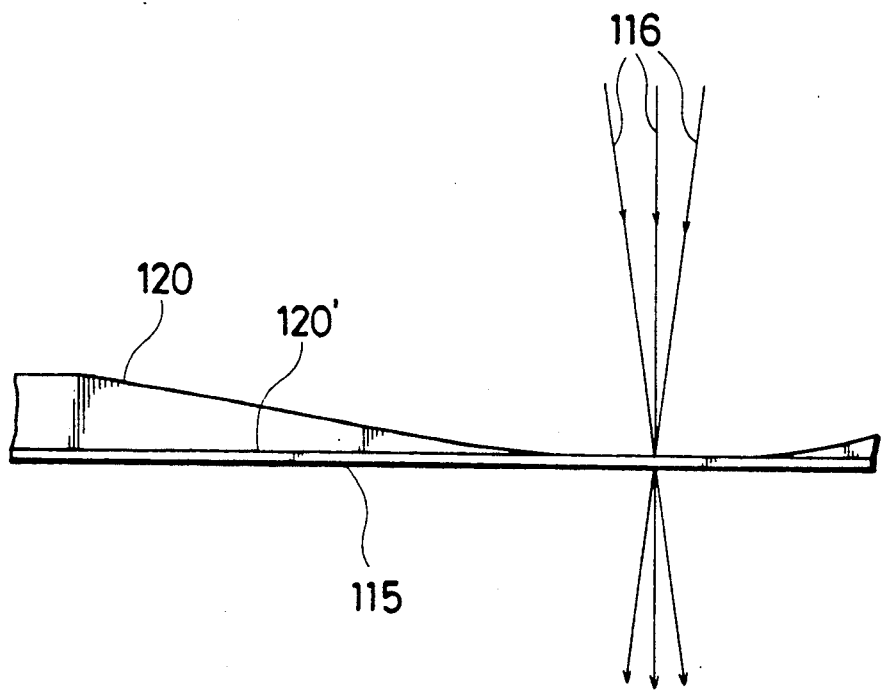
FIG. 11 is a view for explaining the conventional example corresponding to FIG. 8.

In a prior art, since a polycrystalline silicon 120' is superposed on a dirt layer 115 in a portion through which an electron beam 116 can be transmitted as shown in FIG. 11, an image of the polycrystalline silicon cannot be observed by the transmission type electron microscope separately. As shown in a typical section view of a sample to be observed by the transmission type electron microscope in FIG. 8, in the case where the monocrystalline silicon (material) 120 is superposed on the polycrystalline silicon 120', only the polycrystalline silicon 120' is provided in a portion through which the electron beam 116 can be transmitted. Consequently, it can experimentally be confirmed that the good image of the polycrystalline silicon can be obtained by the transmission type electron microscope.

According to the charged beam processing apparatus 100 K having the above structure, a non-abraded surface, i.e., a portion to be observed by the transmission type electron microscope can be prevented from being made dirty. The non-abraded surface is produced by flaking the material through the charged beam so as to adjust the sample to be observed by the transmission type electron microscope. Consequently, the good image of the sample can be obtained by the transmission type electron microscope. In addition, the precision in composition analysis and electron beam analysis can be increased. Consequently, the precision in evaluation of the material is increased so that the development and research of the material can greatly be promoted.

More specifically, the charged beam processing apparatus 100 K has the following structure. In other words, the surface guard plate through which the light can be transmitted is removably fixed to the non-processed side of the material by means of the springs. In addition, a clearance between the material reinforcing plate and the material supporting table is blocked by the presser plate on the abraded surface side. Consequently, the following effects can be obtained.

(1) In the most important step, i.e., a step of preparing a super thin film, another thin film (a dirt layer) is not formed of substances other than an obstruction material. Therefore, the image of the sample can be prevented from being deteriorated. Consequently, the resolution of the image observed by the transmission type electron microscope can be enhanced.

(2) In the prior art, if the dirt layer adheres to the thin film, the charged beam is radiated on the dirt layer to be abraded and removed again so that the image observed by the transmission type electron microscope can be prevented from being deteriorated. However, when the dirt layer is abraded, the portion to be observed is also abraded frequently. Even if the portion to be observed is slightly abraded, the damage is caused by the abrasion. Consequently, the good image cannot be obtained. According to the apparatus of the present invention, since the dirt layer does not adhere to the thin film, it is not required to radiate the charged beam on the portion to be observed. Therefore, the portion to be observed can be held in its original state. Consequently, the good image can easily be obtained.

(3) The transmission type electron microscope also has a function of obtaining an electron beam analysis image. A harrow pattern showing an amorphous state appears on the dirt layer. Accordingly to the apparatus of the present invention, in the case where it is not clear whether the material is in the amorphous or crystalline state, or the material is in the amorphous state, the harrow pattern odes not appear on the dirt layer formed on the portion to be observed. Consequently, the crystallization of the material can be evaluated more precisely.

(4) Some of the transmission type electron microscopes have an analyzer attached thereto so that the composition of the material can be analyzed. According to the apparatus mentioned above, if the dirt layer is formed, the composition of he material and dirt layer is simultaneously analyzed. Therefore, the analysis cannot be performed precisely. According to the apparatus of the present invention, the dirt layer is not formed. Consequently, the composition of the material can be analyzed precisely.

(5) Since the surface guard plate is formed of a material through which the light can be transmitted, the dirt layer does not adhere to the material. Consequently, there can be held a function of detecting an abrasion end point.

(6) When the surface guard plate is used for hours, the dirt layer gradually adheres to the surface of the surface guard plate. According to the apparatus of the present invention, however, the surface guard plate is fixed by the springs so as to be removed freely. Consequently, if the dirt layer adheres to the material so as to disorder the function of detecting an abrasion end point, the surface guard plate can freely be exchanged with a new one.

What is claimed is:

1. A charged beam processing apparatus comprising:
   a supporting table having a hole provided in the center thereof,
   a material reinforcing plate for supporting a sample chip piece, said material reinforcing plate being of an annular shape and provided on an inner peripheral edge of the hole,
   a surface guard plate pressingly and removably fixed to the supporting table for sealing the hole on a non-abraded surface side of said sample chip piece,
   a frame fixed to the supporting table and holding said surface guard plate,
   an annular presser plate provided on the supporting table for scaling an annular clearance between the supporting table and the material reinforcing plate on the non-abraded surface of the sample chip piece, and
   a charged beam a hole defined in said material reinforcing plate so that the sample chip piece is processed.

2. An apparatus according to claim 1, further comprising springs by which the frame resiliently presses the surface guard plate against a lower surface of the supporting table.

3. An apparatus as in claim 1, wherein said surface guard plate comprises a glass plate having a thickness of about 150 to 200 μm.

4. An apparatus as in claim 1, wherein said supporting table is rotatable.

5. An improved charged particle beam processing apparatus including a rotatable support table having a hole in the center thereof, a material reinforcing plate for supporting a sample chip piece to be processed, wherein the material reinforcing plate is of an annular shape and is provided on an inner peripheral edge of the support table hole, said improvement comprising:

a frame fixed to ne surface of said support table;
a surface guard plate placed within aid frame for covering said support table hole;
resilient means positioned between said frame and said surface guard plate for urging said surface guard plate into sealing engagement with aid support table; and
a presser plate provided on another surface of said support table for covering aid inner peripheral edge of the support table hole while said sample chip piece is processed.

6. The improved apparatus of claim 5, wherein said surface guard plate comprises a glass plate having a thickness of about 150 to 200 μm.

7. The improved apparatus of claim 5, further comprising:

packing material provided between said support table and said surface guard plate as well as between said support table and said presser plate for sealing said plates to said support table.

* * * * *